(12) United States Patent
McCanne et al.

(10) Patent No.: US 7,477,166 B2
(45) Date of Patent: *Jan. 13, 2009

(54) CONTENT-BASED SEGMENTATION SCHEME FOR DATA COMPRESSION IN STORAGE AND TRANSMISSION INCLUDING HIERARCHICAL SEGMENT REPRESENTATION

(75) Inventors: Steven McCanne, Berkeley, CA (US); Michael J. Demmer, San Francisco, CA (US)

(73) Assignee: Riverbed Technology, Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/508,531

(22) Filed: Aug. 22, 2006

(65) Prior Publication Data

US 2007/0018858 A1    Jan. 25, 2007

Related U.S. Application Data

(63) Continuation of application No. 11/223,789, filed on Sep. 8, 2005, now Pat. No. 7,116,249, which is a continuation of application No. 10/968,868, filed on Oct. 18, 2004, now Pat. No. 6,961,009, which is a continuation of application No. 10/731,687, filed on Dec. 8, 2003, now Pat. No. 6,828,925, which is a continuation of application No. 10/285,330, filed on Oct. 30, 2002, now Pat. No. 6,667,700.

(51) Int. Cl.
*H03M 7/38*    (2006.01)
(52) U.S. Cl. .......................... 341/50; 707/102; 707/200; 707/203
(58) Field of Classification Search ........... 341/50–107; 707/100, 102, 200, 203
See application file for complete search history.

(56) References Cited

U.S. PATENT DOCUMENTS 4,377,803 A    3/1983    Lotspiech et al.

(Continued)

FOREIGN PATENT DOCUMENTS

WO    WO 96/25801 A1    8/1996

OTHER PUBLICATIONS

Chakrabarti; "Low-Bandwidth Web Access with Tandem Proxies;" Sep. 2002; 1-64; Massachusetts Institute of Technology.

(Continued)

*Primary Examiner*—Linh V Nguyen
(74) *Attorney, Agent, or Firm*—Townsend and Townsend and Crew LLP

(57) ABSTRACT

In a coding system, input data within a system is encoded. The input data might include sequences of symbols that repeat in the input data or occur in other input data encoded in the system. The encoding includes determining a target segment size, determining a window size, identifying a fingerprint within a window of symbols at an offset in the input data, determining whether the offset is to be designated as a cut point and segmenting the input data as indicated by the set of cut points. For each segment so identified, the encoder determines whether the segment is to be a referenced segment or an unreferenced segment, replacing the segment data of each referenced segment with a reference label and storing a reference binding in a persistent segment store for each referenced segment, if needed. Hierarchically, the process can be repeated by grouping references into groups, replacing the grouped references with a group label, storing a binding between the grouped references and group label, if one is not already present, and repeating the process. The number of levels of hierarchy can be fixed in advanced or it can be determined from the content encoded.

17 Claims, 9 Drawing Sheets

U.S. PATENT DOCUMENTS

| | | | |
|---|---|---|---|
| 5,414,850 A | 5/1995 | Whiting | |
| 5,737,594 A | 4/1998 | Williams | |
| 5,822,746 A | 10/1998 | Williams | |
| 5,990,810 A * | 11/1999 | Williams | 341/51 |
| 6,163,811 A | 12/2000 | Porter | |
| 6,301,376 B1 | 10/2001 | Draganoff | |
| 6,333,932 B1 | 12/2001 | Kobayasi et al. | |
| 6,341,171 B1 | 1/2002 | De Lanauze | |
| 6,415,329 B1 | 7/2002 | Gelman et al. | |
| 6,449,658 B1 | 9/2002 | Lafe et al. | |
| 6,452,915 B1 | 9/2002 | Jorgensen | |
| 6,553,141 B1 | 4/2003 | Huffman | |
| 6,642,860 B2 * | 11/2003 | Meulenbroeks | 341/51 |
| 6,667,700 B1 * | 12/2003 | McCanne et al. | 341/51 |
| 6,678,828 B1 | 1/2004 | Pham et al. | |
| 6,704,730 B2 | 3/2004 | Moulton et al. | |
| 6,791,947 B2 | 9/2004 | Oskouy et al. | |
| 6,828,925 B2 | 12/2004 | McCanne et al. | |
| 6,915,302 B1 * | 7/2005 | Christofferson et al. | 707/102 |
| 6,961,009 B2 | 11/2005 | McCanne et al. | |
| 7,269,689 B2 * | 9/2007 | Eshghi et al. | 711/112 |
| 7,366,859 B2 * | 4/2008 | Per et al. | 711/162 |
| 7,398,283 B2 * | 7/2008 | Margolus et al. | 707/200 |
| 7,412,462 B2 * | 8/2008 | Margolus et al. | 707/200 |
| 2002/0003795 A1 | 1/2002 | Oskouy et al. | |
| 2002/0087547 A1 | 7/2002 | Kausik et al. | |
| 2002/0138511 A1 | 9/2002 | Psounis et al. | |
| 2002/0194382 A1 | 12/2002 | Kausik et al. | |
| 2007/0083571 A1 * | 4/2007 | Meller et al. | 707/203 |
| 2007/0150891 A1 * | 6/2007 | Shapiro | 717/174 |

OTHER PUBLICATIONS

Manber, Udi et al., "A Text Compression Scheme That Allows Fast Searching Directly in the Compressed File", *Department of Computer Science*, Mar. 1993, pp. 1-12, Technical Report #93-07, University of Arizona, Tucson, Arizona.

Manber, Udi et al., "Finding Similar Files in a Large File System", *Department of Computer Science*, Oct. 1993, pp. 1-10, Technical Report #93-33, University of Arizona, Tucson, Arizona.

Manber, Udi et al., "GLIMPSE: A Tool to Search Through Entire File Systems", *Department of Computer Science*, Oct. 1993, pp. 1-10, Technical Report #93-34, University of Arizona, Tucson, Arizona.

Mellia, Marco et al.; "TCP Smart-Framing: using smart segments to enhance the performance of TCP"; Dipartimento di Elettronica, Politecnico di Torino, 10129 Torino, Italy, pp. 1708-1712, date unknown.

Muthitacharoen, et al., "A Low-bandwidth File System", Symposium on Operating Systems Principles, 2001, pp. 147-187, URL=http://www.pdos.lcs.mit.edu/papers/lbfs:sosp01/lbfs.pdf, no month.

Sayood, Khalid et al., "Recursively Indexed Quantization of Memoryless Sources", *IEEE Transactions On Information Theory*, Sep. 1992, pp. 1602-1609, vol. IT-38, No. 5.

Spring, Neil T., "A Protocol-Independent Technique for Eliminating Redundant Network Traffic", Aug. 2000, Proceedings of {ACM} {SIGCOMM}, 9 pp., URL=http://www.acm.org/sigs/sigcomm/sigcomm2000/conf/paper/sigcomm2000-3-1.pdf.

"Unleashing the True Power of Today's Networks", *A Peribit White Paper*, Aug. 2002, pp. 1-13, URL=http://www.peribit.com/products/etc/0217w02punl.htm.

Factor, Michael and Sheinwald, Dafna, "Compression in the presence of shared data;" 2001; *Information Sciences*; vol. 135; pp. 29-41.

Housel, B.C. and Shields, I., "Emulator Express: A system for optimizing emulator performance for wireless networks;" 2000; *IBM Systems Journal*; vol. 39; No. 2; pp. 384-402.

Muthitacharoen, A. et al., "A Low-bandwidth Network File System," *Proceedings of the 18th ACM Symposium on Operating System Principles (SOSP'01)*, Oct. 21-24, 2001, pp. 174-187.

* cited by examiner

Too Many Levels

CONTENT-BASED SEGMENTATION SCHEME FOR DATA COMPRESSION IN STORAGE AND TRANSMISSION INCLUDING HIERARCHICAL SEGMENT REPRESENTATION

CROSS-REFERENCES TO RELATED APPLICATIONS

This application is a continuation of U.S. patent application Ser. No. 11/223,789 entitled "Content-Based Segmentation Scheme for Data Compression In Storage and Transmission Including Hierarchical Segment Representation" was filed Sep. 8, 2005 with this application and is incorporated by reference herein for all purposes.

BACKGROUND OF THE INVENTION

The present invention relates generally to data compression and more specifically to segmentation used for compression.

Data compression is useful for more efficiently storing and transmitting data. Data compression is a process of representing input data as compressed data such that the compressed data comprises fewer bits or symbols than the input data and is such that the compressed data can be decompressed into at least a suitable approximation of the original input data. Compression allows for more efficient transmission of data, as fewer bits need to be sent to allow a receiver to recover the original set of bits (exactly or approximately) and compression allows for more efficient storage as fewer bits need be stored.

"Compression ratio" refers to the ratio of the number of bits or symbols in the original data to the number of bits or symbols in the compressed data. For example, if a sequence of 100 bytes of data is representable by 5 bytes of data, the compression ratio in that example is 20:1. If the input data need not be recovered exactly, so called "lossy compression" can be used, generally resulting in greater compression ratios than "lossless" compression. In a typical application where the compression is to be transparent, the compression should be lossless.

Compression based on the structure and statistics of the input content is common. A typical compressor receives an input stream or block of data and produces a compressed stream or block, taking into account the symbol values in the input, the position of particular symbol values in the input, relationships among various symbol values in the input, as well as the expected nature of the source of input data. For example, where the input data is expected to be English text, it is highly likely that the output of the source following a "." (period) symbol is a " " (blank space) symbol. This characteristic of the source can be exploited by the compressor. For example, the blank space might be represented by no symbol at all in the compressed data, thus reducing the data by one symbol. Of course, in order to have the compressed data be decompressable losslessly, the compressor would have to encode special notations for each instance where a period is not followed by a blank space. However, given their relative frequency of occurrence, many more omissions can be expected than special notations, so the overall result is net compression.

One method of compression used with sources that are likely to contain repeated sequences of input characters is the dictionary approach. With this approach, a dictionary of symbol sequences is built up and each occurrence of one of the symbol sequences in the dictionary is replaced with the index into the dictionary. Where the compressor and the decompressor have access to the same dictionary, the decompressor can losslessly decompress the compressed data by replacing each dictionary reference with the corresponding entry. Generally, dictionary compression assumes that an input stream can be divided into sequences and that those sequences will recur later in the input stream.

Of course, for the dictionary approach to work, the decompressor has to have a copy of the dictionary used by the compressor. Where the compression is for reducing transmission efforts, the compressor and the decompressor are normally separated by the transmission channel over which efforts are being reduced, but the load on the channel may be increased if the dictionary is sent over that channel. A similar issue arises where compression is to be applied for reducing storage, as the dictionary needs to be stored so the decompressor has access to it and that adds to the storage effort. In some schemes, the dictionary is a fixed dictionary and thus it can be amortized over many compressions to reduce the per compression cost of the dictionary to where the overhead is insignificant. In other schemes, the dictionary is adaptive, but is reconstructable from data already available to the decompressor, but as previously decompressed symbols.

Compression is useful in networks where network traffic is limited by bandwidth constraints. One example is a wide area network (WAN), such as the Internet, which generally has less free bandwidth per use than other networks, such as a dedicated local area network (LAN) or a dedicated WAN. For cost reasons, many would like to use nondedicated WANs instead of relying only on LANs or adding dedicated WANs, but are constrained by the performance of nondedicated WANs. Compression can potentially make it feasible to use a low bandwidth link for high bandwidth applications since it reduces the number of actual bits required to represent a larger input sequence. Similarly, compression can potentially enhance performance or capacity of a file system by reducing the number of bits required to represent all of the files in the system.

In general, data stored and communicated across enterprise systems and networks often has high degrees of information redundancy present. For example, e-mail messages and attachments sent to large numbers of recipients in a corporation generate many redundant copies of the message data in storage systems as well as cause redundant traffic to be sent across the network. Likewise, many electronic documents within an enterprise share very high degrees of commonality as different employees work with similar pieces of corporate information in different settings.

If such data were compressed, network performance would improve and effective storage capacity would increase. Traditional compression schemes can exploit some of these redundancies by detecting statistical correlations in an input symbol stream and encoding the stream's symbols in as few bits as possible based on the statistical correlations. Some dictionary-based compression schemes are known as "universal codes" in that they converge to the optimal compression scheme (the Shannon limit) under various assumptions including the assumption that the input symbols conform to a stationary random process. This would imply then that one could achieve optimal performance simply by deploying a universal coding system that performed optimal compression of network traffic in a network or of file data in a storage system.

However, this approach does not necessarily work well in practice. For example, it is well known that enabling compression on the network interface of a router improves performance, but only marginally (30% is typical but it depends on the underlying traffic). One problem with traditional universal coding schemes is that they do not necessarily converge to optimal rate if the underlying data input has non-stationary statistics. Moreover, if the underlying statistics are stationary but they exhibit "long-range dependence" (LRD), the rate of convergence of the universal code to optimality could be impractically slow (perhaps exponentially slow). This has important consequences as many studies have provided evidence that network traffic exhibits LRD, and in fact, there is an open controversy as to whether the underlying data processes are best modeled as LRD random processes or non-stationary processes. Other studies have shown that file statistics (like size distributions, etc.) also exhibit LRD. In short, this all means that traditional methods of universal coding are not necessarily the best practical solution, and a technique that exploits long-range dependence of typical data sources is likely to do better.

One brute-force approach to detecting long-range correlations is to employ a dictionary-based compression scheme that searches with great breadth over a data source (a file, a communication stream, etc.) for patterns that are repeated, represent those patterns with a name or label and store the corresponding data in a table or database in association with the name or label. To exploit LRD, a very large window of data could be kept that allows the system to peer arbitrarily far back in the input (or in time) to detect long-range dependent patterns. This simple model intuitively matches the structure of information in an enterprise. That is, many similar sources of information both change slowly over time and appear in different contexts (email, file systems, Web, etc). As underlying technology improves (e.g., disks and memory become increasingly less expensive), this approach becomes even more practical. However, the brute-force approach still has shortcomings.

One shortcoming is that searching for arbitrary patterns of matching data in a bit stream is computationally expensive and the general problem of finding the optimal solution quickly and efficiently in the presence of LRD statistics has not been adequately solved. An alternative approach is to abandon the ideal of finding an optimal solution and instead focus on approximate solutions or heuristics that perform well in the light of LRD and are practical and feasible.

One tool that proves useful in this framework is a proposed heuristic for finding repeated patterns in data by segmenting the data based on the input content itself, rather than some externally imposed blocking or framing scheme. See, for example, Muthitacharoen, A., et al., "A Low-Bandwidth Network File System", in Proceedings of the 18th ACM Symposium on Operating Systems Principles, SOSP '01, Chateau Lake Louise, Banff, Canada, October 2001, in vol. 35, 5 of *ACM SIGOPS Operating Systems Review*, pp. 174-187, (ACM Press, City), year published. In the LBFS system described therein, portions of transmitted files are replaced with hashes, and the recipient uses the hashes to reconstruct which portion of which file-on-a-file system corresponds to the replaced data. Another example of segmentation based-on-input content is described in the context of matching portions of files, as described by Manber, "Finding Similar Files in a Large File System", *USENIX Proceedings*, San Francisco 1994 (available as *University of Arizona Dept. of Comp. Sci. Technical Report TR*93-33).

Other attempts to reduce network traffic through dictionary-style compression techniques have been applied at the network layer. One such technique includes representing portions of network traffic with tokens and maintaining tables of tokens at each end of a connection. See, for example, Spring, N., et al., "A Protocol-Independent Technique for Eliminating Redundant Network Traffic", in *Proceedings of ACM SIGCOMM* (August 2000). As described in that reference, network traffic that contains redundancies can be reduced by identifying repeated strings and replacing the repeated strings with tokens to be resolved from a shared table at either end of a connection. Because this approach operates solely on individual packets, the performance gains that accrue are limited by the ratio of the packet payload size to the packet header (since the packet header is generally not compressible using the described technique). Also, because the mechanism is implemented at the packet level, it applies only to regions of the network where two ends of a communicating path have been configured with the device. This configuration can be difficult to achieve, if not impractical, in certain environments. Also, by indexing network packets using a relatively small memory-based table with a first-in first-out replacement policy (without the aid of, for instance, a large disk-based backing store), the efficacy of the approach is limited to detecting and exploiting communication redundancies that are fairly localized in time, i.e., the approach can not exploit LRD properties of the underlying data stream.

An alternative approach to reduce network traffic involves caching, where a request for data is not sent over the network if a copy of the data is available locally in a cache. As used herein, the terms "near", "far", "local" and "remote" might refer to physical distance, but more typically they refer to effective distance. The effective distance between two computers, computing devices, servers, clients, peripherals, etc. is, at least approximately, a measure of the difficulty of getting data between the two computers.

While caching is good for blocks of data that do not change and are not found in similar forms under different names, improvements are still needed in many cases. In file caching, the unit of caching is typically a block of a file or the whole file. If the same data is present in a different file, or two files have only small differences, caching will not remove the redundancies or exploit them to reduce communication costs. Even if a data object is segmented into many blocks and each of the blocks is cached separately, the net result is still inefficient because a small insertion or deletion of data in the underlying object will cause the data to shift through many (if not all) of the blocks and thus nullify the benefits of caching. This because the blocks are imposed arbitrarily on the input stream, and so it is impossible to detect that only a small change has been made to the underlying data.

In view of the above, improvements can be made in compressing data in a network environment, in storage systems, and elsewhere.

BRIEF SUMMARY OF THE INVENTION

In a coding system according to one embodiment of the present invention, input data within a system is encoded. The input data might include sequences of symbols that repeat in the input data or occur in other input data encoded in the system. The encoding includes determining one or more target segment sizes, determining one or more window sizes, identifying a fingerprint within a window of symbols at an offset in the input data, determining whether the offset is to be designated as a cut point and segmenting the input data as indicated by the set of cut points. For each segment so identified, the encoder determines whether the segment is to be a referenced segment or an unreferenced segment, replacing the segment data of each referenced segment with a reference label and storing a reference binding in a persistent segment store for each referenced segment, if needed. Hierarchically, the process can be repeated by segmenting the reference label strings into groups, replacing the grouped references with a group label, storing a binding between the grouped references and group label, if one is not already present, and repeating the process. The number of levels of hierarchy can be fixed in advanced or it can be determined from the content encoded.

Other features and advantages of the invention will be apparent in view of the following detailed description and preferred embodiments.

DETAILED DESCRIPTION OF THE INVENTION

The present invention has many applications, as will be apparent after reading this disclosure. In describing an embodiment of a compression system according to the present invention, only a few of the possible variations are described. Other applications and variations will be apparent to one of ordinary skill in the art, so the invention should not be construed as narrowly as the examples, but rather in accordance with the appended claims.

Coding (encoding, decoding) can be done by a number of different devices, which might involve hardware, software, or both. Coding can be done with a computer, computing device, peripheral, electronics, or the like, and/or using an application being executed or controlled by such element. Coding might be done incident to a transport process, such as that described in McCanne I. Using the coding apparatus and processes described herein, the responsiveness of transactions over a network can be improved by lessening the number of bits that need to be transmitted at critical times over critical channels. Also, the coding system may be integrated into a stand-alone storage system to optimize capacity. In this environment, the effective capacity of a storage system can be enhanced as the coding system described herein extracts common sequences of data and stores them just once, even if the sequence appears potentially many times, in potentially many different files.

Figure 1:
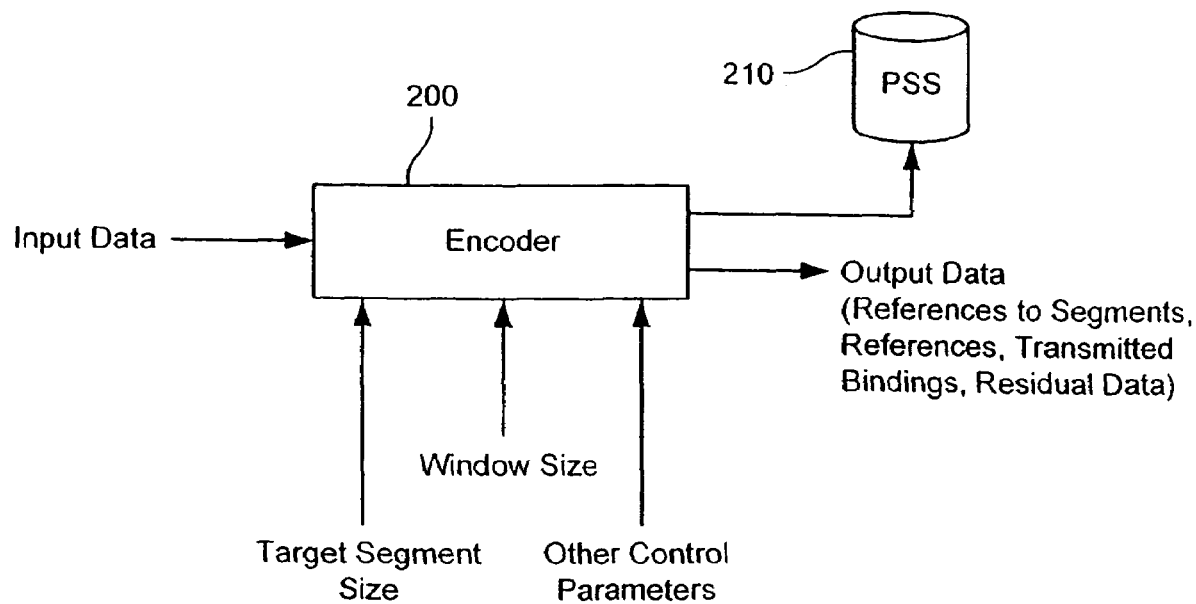
FIG. 1 is a block diagram of an encoder that encodes a data stream or block using segmentation based on content and segment references.

FIG. 1 illustrates the particular inputs that an encoder might have. As shown there, an encoder has an input for receiving input data and inputs for parameters, such as target segment size, window size and other control parameters, as well as outputs for the output data and bindings generated in the encoding process, which are stored in a persistent segment store (PSS) 210 as needed. In operation, encoder 140 would process input data, identify segments of data, replace the segment's data with a reference, provide the segment data and a segment reference to PSS 142 in the form of a binding and output the encoded data. The encoded output data might include unreferenced segment data, embedded bindings and/or reference labels for referenced segments. In the simplest case, the output data is entirely reference labels.

The target segment size parameter is used by the encoder to control the average size of a segment. In general, segments are variable length and there are design tradeoffs in selection of this size as described below.

Figure 2:
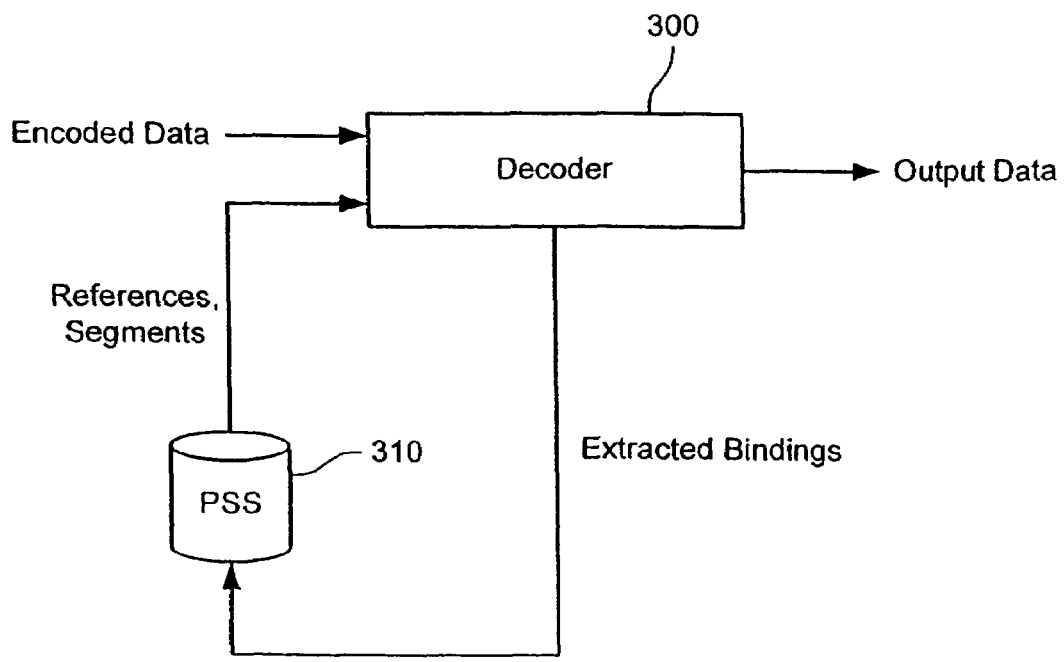
FIG. 2 is a block diagram of a decoder that decodes a data stream or block using segmentation bindings from a persistent segment store.

FIG. 2 illustrates a decoder 300 and a PSS 310, which together perform decoding that is the inverse of the encoding done by encoder 200. As described above, the encoded data might comprise references, bindings and unreferenced residual data. When decoder 150 encounters a binding in received data, it can use the segment data in that binding to reconstruct the original data and it can also store the binding in its PSS. When decoder 150 encounters a reference without a binding, it can use the reference to obtain segment data from PSS 152 to reconstruct the segment. If the segment reference is not found in PSS 152, decoder 150 can send a request for the segment data.

Figure 3:
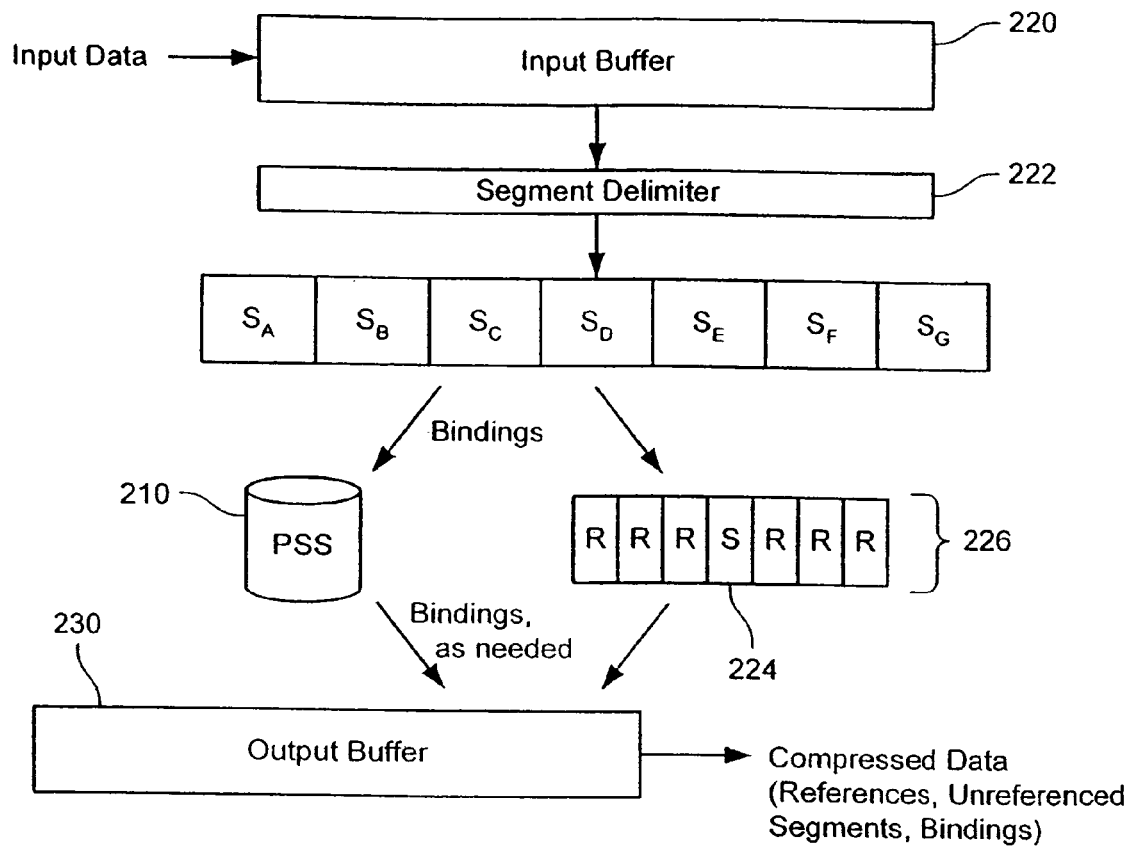
FIG. 3 is a diagram illustrating an encoding process in more detail.

FIG. 3 is a diagram illustrating an encoding process in more detail. As shown there, input data to be encoded is stored in buffer 220, segmented by segment delimiter 222, which creates the output references and bindings for PSS 210. The output references, unreferenced segments, such as segment 224, and bindings as needed are provided to an output buffer 230 to form the output of the encoder.

Figure 4:
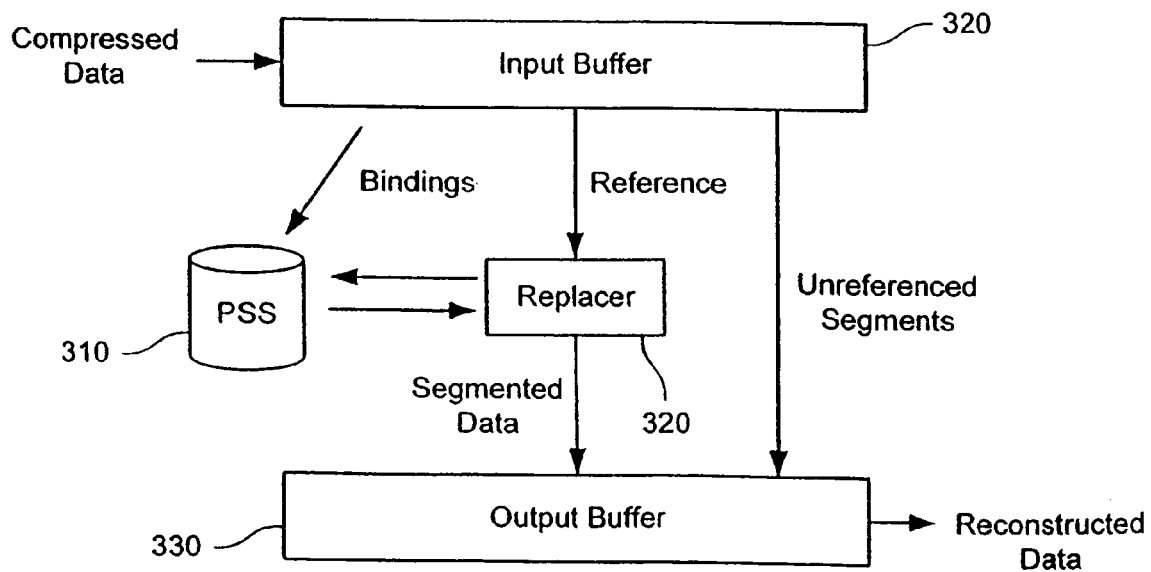
FIG. 4 is a diagram illustrating a decoding process in more detail.

FIG. 4 is a diagram illustrating a decoding process in more detail. As shown there, encoded data is buffered in an input buffer 320. From the buffer contents, bindings are extracted and stored in PSS 310. Reference labels are provided to a replacer 325 that replaces them with the referenced segment data and places the data in an output buffer 330. Unreferenced segment data is output directly to output buffer 330 for eventual output as the reconstructed data.

As the above-described figures illustrate, one aspect of the encoding process is the segmentation of input data. In a process for segmenting, identifying "cut points", such as offsets in the input data where one segment ends and the next segment begins, is equivalent to segregating the input data into separate data structures, or the like.

If a segmentation scheme is designed appropriately, segment boundaries should always appear in the same place for the same sequences of data, regardless of the context in which that data appeared. If that were the case, commonly repeated patterns of data would be segmented in the same way over each repetition of data and a system could be designed to efficiently identify these repeated patterns. For example, a particular data sequence (such as pieces of a widely used GIF image or pieces of a bitmap representing a commonly used graphical icon) that appears in many different locations in larger files (such as a word processing document, slide presentation document, or on a Web page) will always be found and segmented in the same way, regardless of what data surrounds it.

To achieve this property, the segmentation scheme herein uses information in the data itself to guide the segmentation process rather than externally imposed parameters like block sizes, transaction boundaries, etc. As input data is consumed by the coding process, the various values and structure of the input symbols guide the segmentation process (as described below). Consequently, the system has a "self-synchronizing" property where if similar data patterns are presented to its input, the same segment boundaries are detected, inducing the formation of the same segments that have been seen in the past. Moreover, this means that the system is robust to insertions, deletions, or other changes in the underlying input data, in that once a previously present segment boundary is found, the new segment will match an existing segment from that point on (assuming the data pattern from that point on has been seen in the past).

Because this scheme is guided by the content of the input, it is described herein as "content-induced segmentation". By applying content-induced segmentation to an input stream with repeated patterns across very large time scales (i.e., exhibiting LRD statistics), the same segments are created without having to keep track of the entire history of data patterns that have been seen in the past. That is, the segmentation process can simply segment the input based on the input itself without having to search over the existing data patterns already found. While, in general, this approach does not produce the optimal segmentation (i.e., maximizing the size of segments while simultaneously maximizing the number of repeated segments found), it provides a good tradeoff between complexity and performance—the scheme is effective at exploiting certain types of LRD while leading to an efficient and practical implementation.

Content-Induced Segmentation

A segmenter, such as segment delimiter 222 in FIG. 3 operates on a portion (or all) of a set of input data. The segmenter batches up a certain number of input symbols (determined by the current offset and the window size parameter) and computes a hash function over the window. This is referred to as the fingerprint of the window. A deterministic fingerprint indicator function returns a Boolean value for each fingerprint indicating whether the offset is to be considered a cut point and thereby defines a segment boundary. Preferably, the window does not extend beyond either end of an application data unit (ADU), so that each window contribution is from exactly one ADU. Thus, preferably, the encoder is provided an indication in an input data stream where one ADU ends and another one starts. However, such indication is not necessary for correct operation of the system. Rather, these indications allow the encoder to force a segment boundary in the stream where an ADU boundary ends and thus prevent practical inefficiencies such as extra delays waiting for data that might not ever arrive (e.g., relying upon an implementation time-out to force a segment boundary instead). Additionally, restricting segment boundaries to be within a single ADU prevents the system from detecting and storing segments that are unlikely to be repeated in the future as may happen if a segment spans two ADUs.

Where the fingerprint indicator function values are 1 and 0, 1 might represent a cut point and 0 represent other than a cut point. Thus, under one convention, when the function evaluates to 1 for a given fingerprint having a given offset and window, a new segment is created at the symbol defined by the first symbol of the input data (in order according to an input data order). Under that convention, if the function evaluates to 0, then one more input symbol is consumed and the window is advanced to cover this new symbol (and the least current symbol is removed from the window but remains in the current segment). The target segment size can thus be controlled as a parameter of the fingerprint indicator function.

Since a well-chosen fingerprint function will tend to create random bit patterns in the fingerprint, the Bernoulli distribution function of a random variable, parameterized by the target segment size, can be used to map the hash value into the indicator value. For example, the parameter can be chosen such that on average, assuming a random distribution of fingerprint inputs, 1 out of M times, the function evaluates to true. Thus, on average, the segment size is going to be M+W bytes, where W is the window size in use (because a segment is at least W bytes large). Thus, the value of M determines the target segment size.

A variation of the segmentation process allows the window to define the start of a segment boundary instead of the end of a boundary. This allows segments to be arbitrarily small, since the pattern of data used to define the fingerprint window is not necessarily consumed as part of the segment.

In another embodiment, an explicit fingerprint window is not needed. Instead, a hash function is computed over a variable number of input symbols. As each input symbol is consumed, the fingerprint function is re-computed over the entire buffer of consumed symbols. Again, a subsequent indicator function applied to the fingerprint decides when and if to insert a new segment boundary at the current point in the input. This approach is, in general, less efficient than the previous approach because changes in data near the start of a segment impact the segmentation process going forward. Consequently, segment boundaries that would have otherwise been created and matched against previous segments are missed due to changes in data that can be far removed from the desired segment boundary. The windowing approach described earlier accomplishes exactly this goal.

The fingerprint hashing scheme can be made efficient by using a hash function that can be incrementally updated as input symbols are read. Examples of efficient generation of hash functions for incrementally updated windows are known and need not be described in further detail here. See, for example, Rabin, *"Fingerprinting by Random Polynomials"*, Technical Report TR-15-81, Dept. of Comp Sci., Harvard University (1981).

When a new segment is defined (by finding a new segment boundary), the segment is compared against all the existing segments that are stored in the PSS. This lookup process can be made efficient by maintaining an index of segments keyed by a hash function computed over the segment data (either the entire segment content, portions of the segment content, the segment fingerprint value, or combinations thereof). For each hash value, the index contains the set of segments present in the PSS that hash to that value. Thus, to determine if a segment exists in the PSS, the encoder computes the hash for the segment in question and performs a lookup on the segment index using said hash. If the lookup fails, the segment cannot be in the PSS. If the lookup succeeds, the encoder can compare each segment returned by the lookup to the segment in question to check for an exact match. This handles the rare case that multiple segments hash to the same hash index.

Continuing the description of the encoding process, if an acceptable segment (usually an identical segment, but in special cases, complete identity is not required) is not present, a new unique name is assigned to the new segment and the binding (reference label, segment data) is entered into the PSS. Where needed, the binding can be compressed, but in the simplest case where the PSS is not constrained, the binding might be stored as a record in a database with fields in each record for storing a string representing the reference label and data representing the segment data. In addition, the segment data within the binding could be itself compressed using a traditional compression algorithm that effectively exploits the short-range dependence present in any segment data. This could be especially useful in the nonterminal segments (described below) that comprise strings of labels that could have a high degree of redundancy depending on the details of the segment naming scheme.

If a comparable segment is present, then its previously defined reference label is used for the new segment and no new binding is created. That reference label is then output instead of the actual segment data, as illustrated by a sequence 226 shown in FIG. 3 Thus, the original input data is represented as a sequence of reference labels bound to data objects stored in the PSS. Some of the data might not be replaced by reference labels, such as where it is determined that replacement of a particular segment (for example, segment 224 in FIG. 3 with a reference label will not substantially improve performance. However, in some embodiments, all of the segments are represented with reference labels.

The reference labels might not be compactly represented, resulting in more bits being used for sequence 226 than necessary. If that is the case, reference labels might, in turn, be compressed using traditional methods for compression, e.g., differential encoding of the reference labels followed by run-length coding and or Huffman coding, or other approaches.

FIG. 4 illustrates a decoding process, which is the inverse of what is shown in FIG. 3 The encoded data (reference labels and possibly also bindings and unreferenced segment data) is received into input buffer 320. From that input buffer data, bindings are extracted and stored in PSS 310 and unreferenced segment data is moved to output buffer 330. Referenced segments, which are represented in the encoded data as reference labels (or compressed reference labels), are replaced with their segment data by replacer 325 using the reference labels to locate bindings in PSS 310 and thus obtain the corresponding segment data. Since reference labels are unique for unique data, the correct segment data can always be provided. If the referenced bindings are not present in PSS 310, they can be requested from, for example, PSS 210. Where encoding is done for storage purposes, PSS 210 and PSS 310 might be one data structure, written by the encoder and read by the decoder.

In many cases, the parameters for the encoding process need to be chosen carefully for good performance. If the target segment size chosen is very large, then the effective compression ratio might be high, because large numbers of symbols are grouped into segments and replaced with a relatively small number of bits representing the segment's reference label. However, a large target block size might tend to miss finer-grained repetitions of data, and add to the overhead of storing and moving multiple versions of nearly similar segment data. On the other hand, if the target segment size chosen is very small, the compression ratio might be low, because the number of bits required to represent a reference label might not be substantially less than the number of bits in the original segment data. In general, the degree to which a particular segmentation scheme is effective depends on the underlying statistics of the data. This problem can be solved by introducing hierarchy into the reference label scheme. This approach is referred to herein as Hierarchical Content-Induced Segmentation (HCS).

Hierarchical Content-Induced Segmentation

In order to get the benefits of large target block sizes (such as high compression ratios) and the benefits of small target block sizes (such as having finer-grained repetitions noticed and segmented as such), hierarchical referencing can be used. In such a system, input data to be encoded might be segmented using a small target block size, yielding many reference labels. The reference labels are, in turn, grouped and replaced with group labels, with reference bindings (group labels, sequence of reference labels forming the group) stored in a PSS-like structure. This allows a single technique to be used over various types of repetitive data, whether the repetitive patterns occur on a fine-grain or a course-grain basis. To capture fine-grained repetitive patterns, the target block size chosen is relatively small. A small target block size can be expected to result in a more verbose encoded reference stream, but the hierarchical referencing will tend to reduce the overhead of having many reference label patterns repeat, in effect having each resulting label in the final result represent as large a span of the input data as can be found repeating. The hierarchical referencing can use a different target block size at each level that is tuned to the relative size of the reference names at that level, or it can use the same size. Similarly it might use a different fingerprint function and/or a different fingerprint window size at each level in the hierarchy, or use the same functions uniformly throughout.

Figure 5:
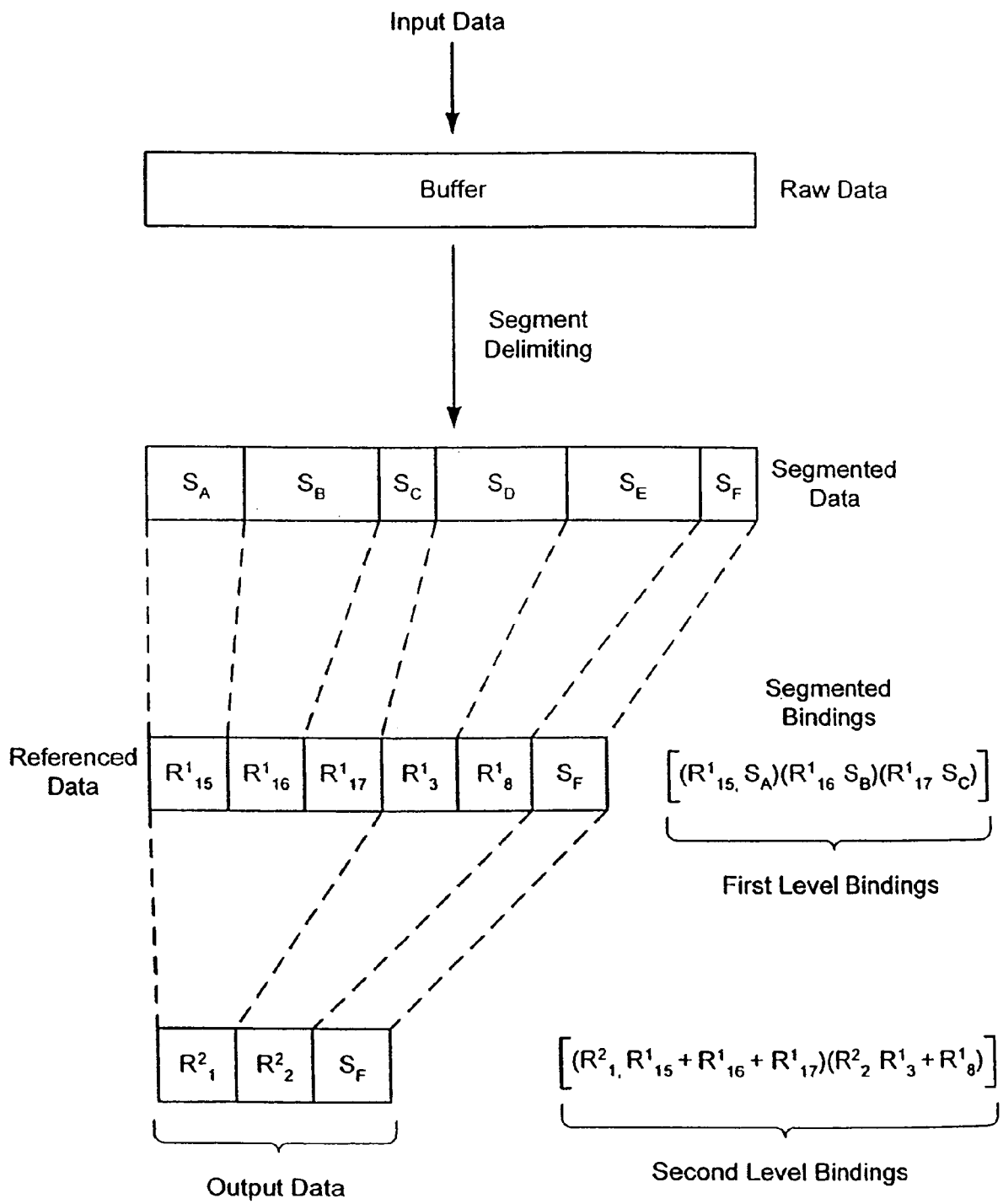
FIG. 5 is a diagram illustrating a hierarchical encoding process.

Two types of such schemes are described below. An example of hierarchical reference encoding is shown in FIG. 5. An input buffer is loaded with input data to be encoded and that input data is segmented into segments $S_A$, $S_B$, $S_C$, $S_D$, $S_E$ and $S_F$. In this example, the first five segments are to be replaced with references and the references happen to be $R^1_{15}$, $R^1_{16}$, $R^1_{17}$, $R^1_3$ and $R^1_8$. Note that the references are not necessarily in order, and this example illustrates that some references (e.g., $R^1_3$ and $R^1_8$.) might be to segment data that were already encountered, in which case a new segment is not used, but the reference is to the preexisting segment.

Ideally, the encoder would then determine, for example, that the sequences ($R^1_{15}$, $R^1_{16}$, $R^1_{17}$) and ($R^1_3$, $R^1_8$) recur frequently, so that they can be grouped and replaced with group labels, such as $R^2_1$ and $R^2_2$, respectively. However, solving this problem in general is difficult (similar in difficulty to solving the same problem directly on the underlying data). Thus, the encoder re-applies the method of content-induced segmentation to the reference label sequence, yielding similar benefits to the original approach but at a higher-level (i.e., relatively low complexity and the ability to find patterns in the input sequence independent of shifts and localized changes to the underlying data). Thus, supposing the segmenter decided that the sequence ($R^2_1$, $R^2_2$, $S_F$) corresponded to a new segment at this higher layer (by reapplying a fingerprint function, window, and indicator), the original input data can then be represented by a reference to the new segment ($R^2_1$, $R^2_2$, $S_F$). Correspondingly, a binding would be entered into the PSS that related the new reference label to the new higher-level segment. Although not present in this example, the final sequence can have reference labels and group labels from any or all levels. As needed, the segment bindings and the reference bindings are stored and/or provided to the decoder.

Fixed-Level HCS

Figure 6:
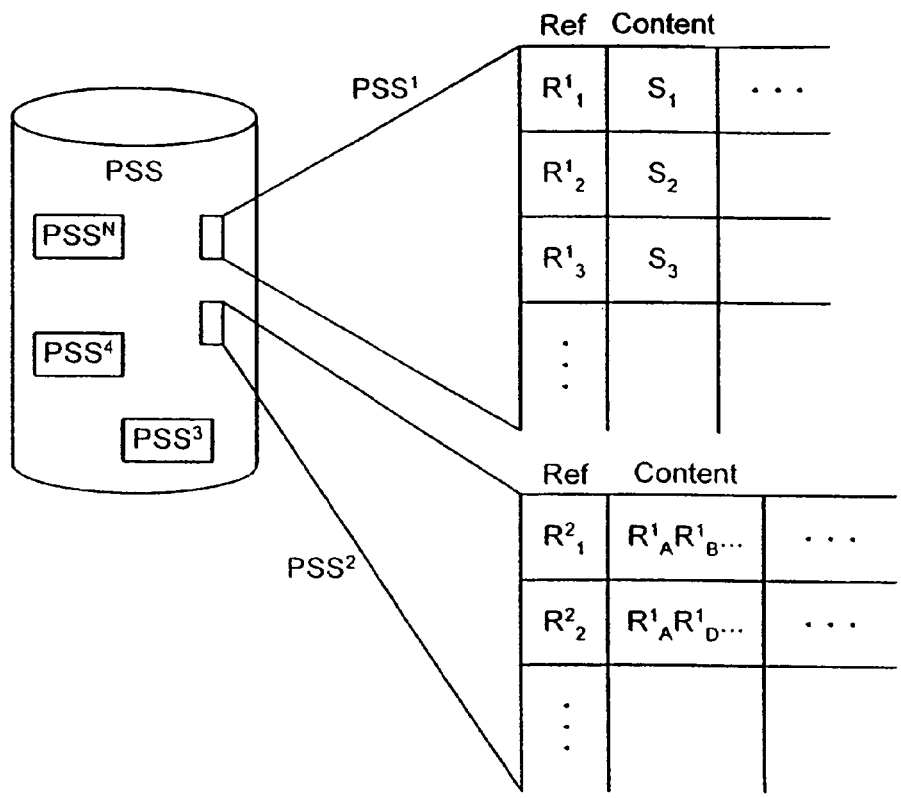
FIG. 6 is an illustration of a persistent segment store having a plurality of level segment stores.

With a fixed-level HCS, the PSS is structured as a set of N (some indeterminate integer greater than one) binding tables $PSS^1, PSS^2, \ldots, PSS^N$. Binding table $PSS^1$ provides bindings between reference labels and segment data. Binding table $PSS^2$ provides bindings between reference label sequences and group labels. Other binding tables provide bindings for groups of groups of reference labels, and so on. This is illustrated in FIG. 6.

The binding tables can store an arbitrary string of bits for each segment and an arbitrary sequence of reference labels. Using the example segmentation and representation from FIG. 5, $PSS^1$ would hold the bindings $(R^1_{15}, S_A)$, $(R^1_{16}, S_B)$, $(R^1_{17}, S_C)$, $(R^1_3, S_D)$ and $(R^1_8, S_E)$ and $PSS^2$ would hold the reference bindings $(R^2_1, R^1_5+R^1_{16}+R^1_{17})$ and $(R^2_2, R^1_3+R^1_8)$.

Using this scheme, all the data in the input buffer might be ultimately represented with a single label, $R^N_1$, and if the data sequence appears again, it will be efficiently represented in a single reference symbol. Likewise, if subsets of the data or slightly altered portions of the data are presented again, the similar portions will be efficiently represented by the same compact symbol string and only the differences will be represented by differing compact symbol strings.

This hierarchical decomposition of the encoding process combined with content-based segmentation has the attractive property that local variations to data, even if arbitrarily large, do not impact the unchanged portions of the repeated data. In a system that used fixed-size segments, every segment would change, for instance, if a few bytes near the front of a data object were inserted or deleted because the data in each fixed-size block would shift and thus look different to the system. In the example of FIG. 5, however, arbitrary amounts of data could be inserted in the object at the points covered by segment $S_C$ and only references $R^1_{17}$ and $R^2_1$ would be impacted. For large data objects, this localization of the impact of allows important performance savings to be exploited by various algorithms built on top of this framework.

Variable-Level HCS

Instead of the fixed N levels of the prior example, the reference grouping can have a variable depth determined at run time. This eliminates the problem of having to choose a value for N that would work over all types and sizes of data.

Figure 7:
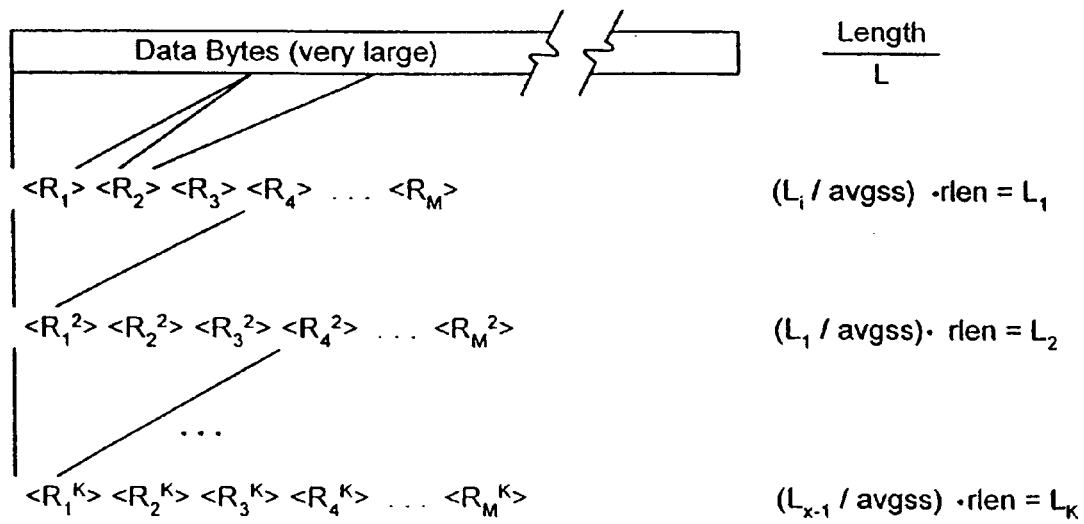
FIG. 7 diagrammatically illustrates a problem with using too few encoding levels.
Figure 8:
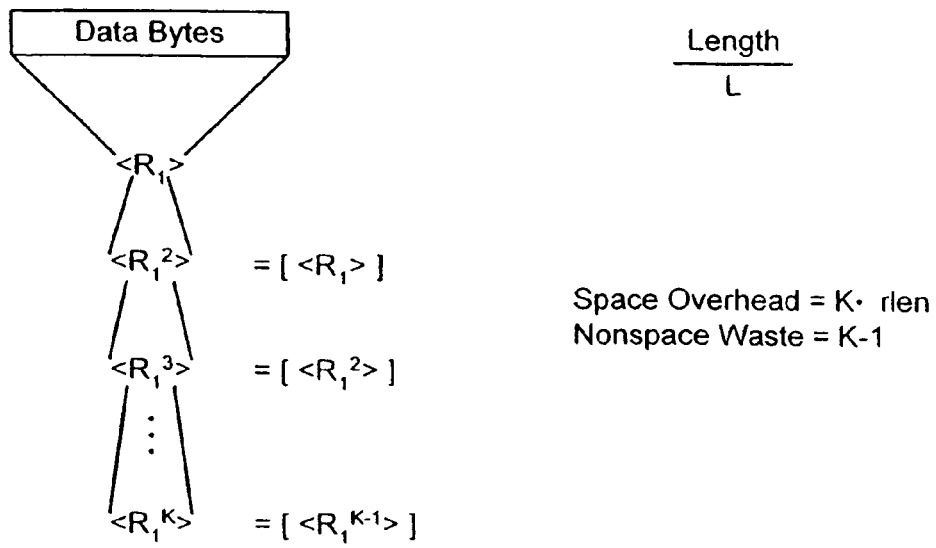
FIG. 8 diagrammatically illustrates a problem with using too few encoding levels.

As outlined in FIG. 7, if the number of encoding levels is too small, then the encoded reference stream for a large block of data will still require many symbols, since many reference labels will still be needed to encode in the underlying data. In other words, if there were more levels of hierarchy, then the number of symbols representing the underlying data at the topmost level would be further reduced. However, if the number of encoding levels is too large, as shown in FIG. 8, then the encoding will introduce unnecessary overhead for small chunks of data, since reference labels will be defined and sent unnecessarily.

Figure 9:
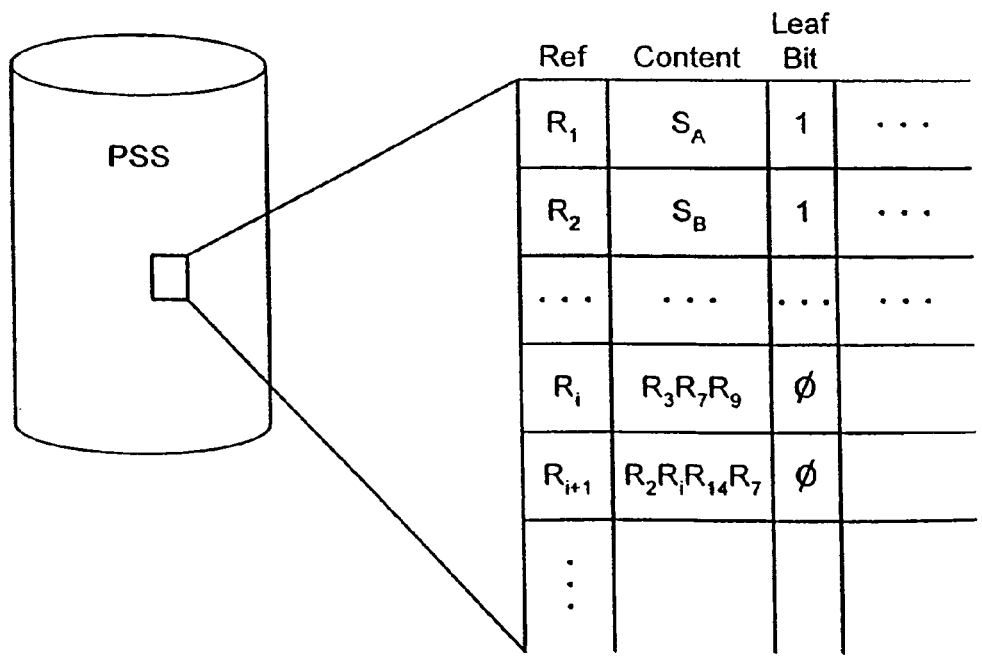
FIG. 9 is an illustration of a persistent segment store organized to hold an arbitrary depth of references.

FIG. 9 is an illustration of a persistent segment store organized to hold an arbitrary depth of references to address this issue. There, instead of each reference label having a specified level (the superscript in the above example), all the references are treated equally, whether they are reference labels for a sequence of segment data symbols, a sequence of reference labels, or a combination of the two. As shown in FIG. 9, reference label $R_1$ is bound to segment data $S_A$, reference label $R_2$ is bound to segment data $S_B$, reference label $R_i$ is bound to a group of reference labels $(R_3, R_7, R_9)$, and so on.

Given that the encoder can flexibly choose appropriate levels of encoding based on the input stream, the decoder should be informed of the number of levels of hierarchy present at any given time. Thus, this information should be somehow conveyed in the coded bit stream. In one embodiment, the coded reference stream explicitly indicates the number of levels, verbatim, in the bit stream with special codes. In this scheme, when the encoder changes the number of levels in use, it would emit a code to explicitly indicate the change.

In an alternative embodiment, the adaptive level structure can be conveyed in the encoded output by marking each segment (as conveyed in a binding) explicitly as being either nonterminal or terminal, as shown in FIG. 9. There, terminal segments represent strings of the final output data while nonterminal segments represent strings of labels. This information would be stored as a "leaf bit" in the PSS, indicating for each binding, whether it terminates the hierarchy and represents the final output data or whether it refers to a sequence of labels that refer to other bindings. A set leaf bit (e.g., a "1") indicates that the record is for a terminal segment and the contents of the record are segment data without any further delimiters and a cleared leaf bit (e.g., a "0") indicates that the record is a sequence of reference labels. Where reference labels are fixed length or have unique decipherability, no space is needed to delimit the references in the group. In another embodiment, the content of each record is encoded such that a reader can determine whether the content includes references or is all just segment data without the presence of a specific leaf bit.

To implement Variable-level HCS, as the encoder consumes the input data stream, it generates new references and appends them to a sequence of first-level reference labels. Each time a new reference is appended to this growing block of labels, the encoder determines whether a segment boundary should be defined using content-induced segmentation applied to the reference label sequence. Thereby, a fingerprint is computed over the label sequence using a fingerprint window and a fingerprint indicator function dictating where to create a new segment boundary. Note that these parameters are independent of the decoding process and do not need to be known by the decoder (rather, they control performance tradeoffs at the encoder). If the fingerprint function indicates that the newly appended reference does not cause the sequence to define a segment boundary, the encoder continues consuming the next input data symbol.

However, if the encoder does detect a new segment boundary in the first-level reference sequence, a new segment is defined comprising the string of reference labels. Similarly to the process that occurs when a new segment is defined in the input data, this new segment is compared against all the existing segments in the appropriate PSS. If an existing segment is found, the existing reference label for that segment is retrieved from the PSS. If no segment is found, a new label is assigned to the block of reference labels and a new binding is added to the PSS (and potentially the output stream). In either case, the second-level label can now be used to express the sequence of first-level reference labels. This new label is then appended to a growing sequence of second-level reference labels. The encoding process examines this second-level reference sequence, applying content-induced segmentation to the second-level sequence of reference labels, again determining if there is a segment boundary and if so, generating a third-level reference for the segment of second-level labels. This process repeats incrementally for subsequent levels of hierarchy, in each case "bubbling up" new reference definitions to the next higher level. In this manner, a large block of data passing through the encoder will likely pass through the recursion multiple times, whereas a small block of data would not undergo unnecessary encoding levels.

Figure 10:
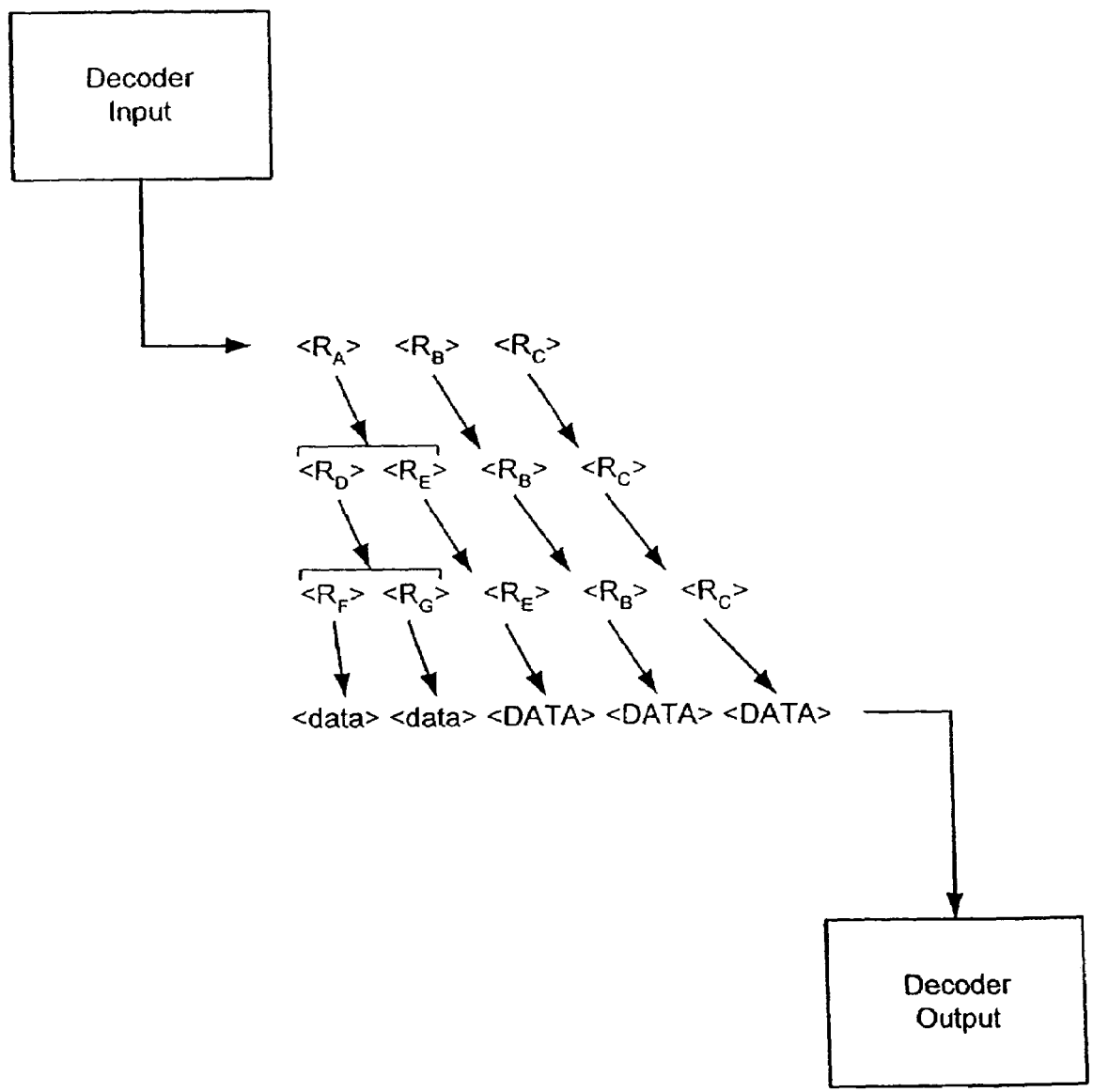
FIG. 10 illustrates a decoding process using the persistent segment store of FIG. 9.

FIG. 10 illustrates a decoding process using the persistent segment store of FIG. 9, wherein each reference label is replaced with the content of its binding. If the segment content contains a sequence of references, these references are in turn replaced, and the process repeats until all of the reference labels refer to terminal nodes and then the segment data can be output. In other words, the decoder recursively resolves reference blocks, terminating when it reaches a data segment. In this embodiment, the encoded stream is equivalent to a hierarchical tree of references where the segments at the leaves of the tree are marked (via the terminal flag) to indicate where the decoding traversal should halt.

Figure 11:
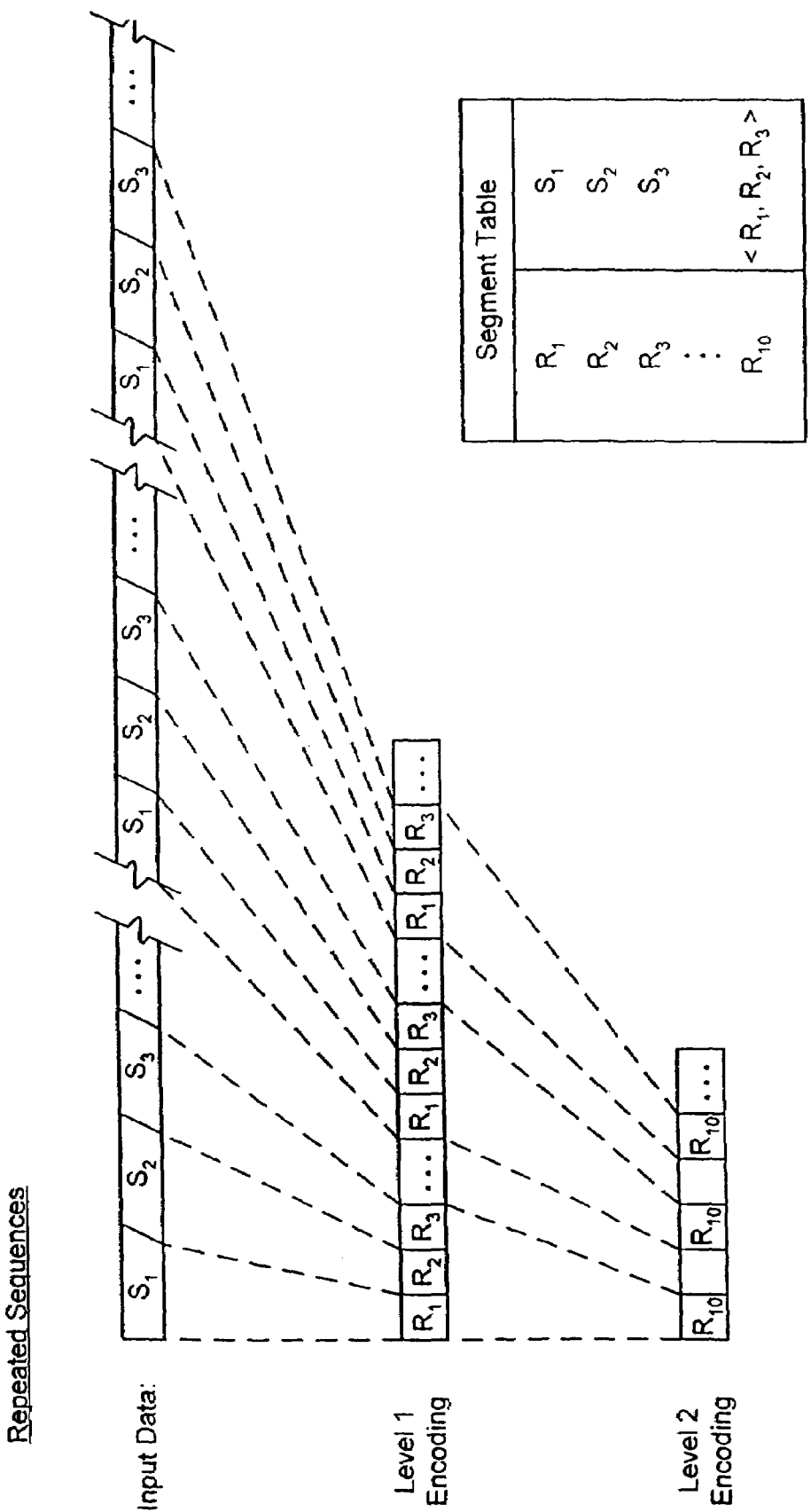
FIG. 11 illustrates hierarchical content-induced segmentation.

One of the benefits of this segmentation scheme is that common patterns within a single input stream can be effectively recognized and compressed. FIG. 11 illustrates one such example. The input stream contains an initial sequence of data bytes that is cut into three segments: $S_1$, $S_2$, and $S_3$. These segments are allocated references $R_1$, $R_2$, and $R_3$. In this example, the remaining input stream contains, among other symbols, the same data repeated twice more. Because the segment cut points are defined as a function of the content, the same segment boundaries will be detected and found in the PSS, and so the same sequence of references will be output. Similarly, assume the hierarchical encoding determines that the sequence of references <$R_1$, $R_2$, $R_3$> defines a cut point for a new segment, labeled $R_{10}$, then again, the single label $R_{10}$ can be used to identify the repeated sequence later on in the input stream.

HCS-Enabled Client-Server Transport Proxy

Figure 12:
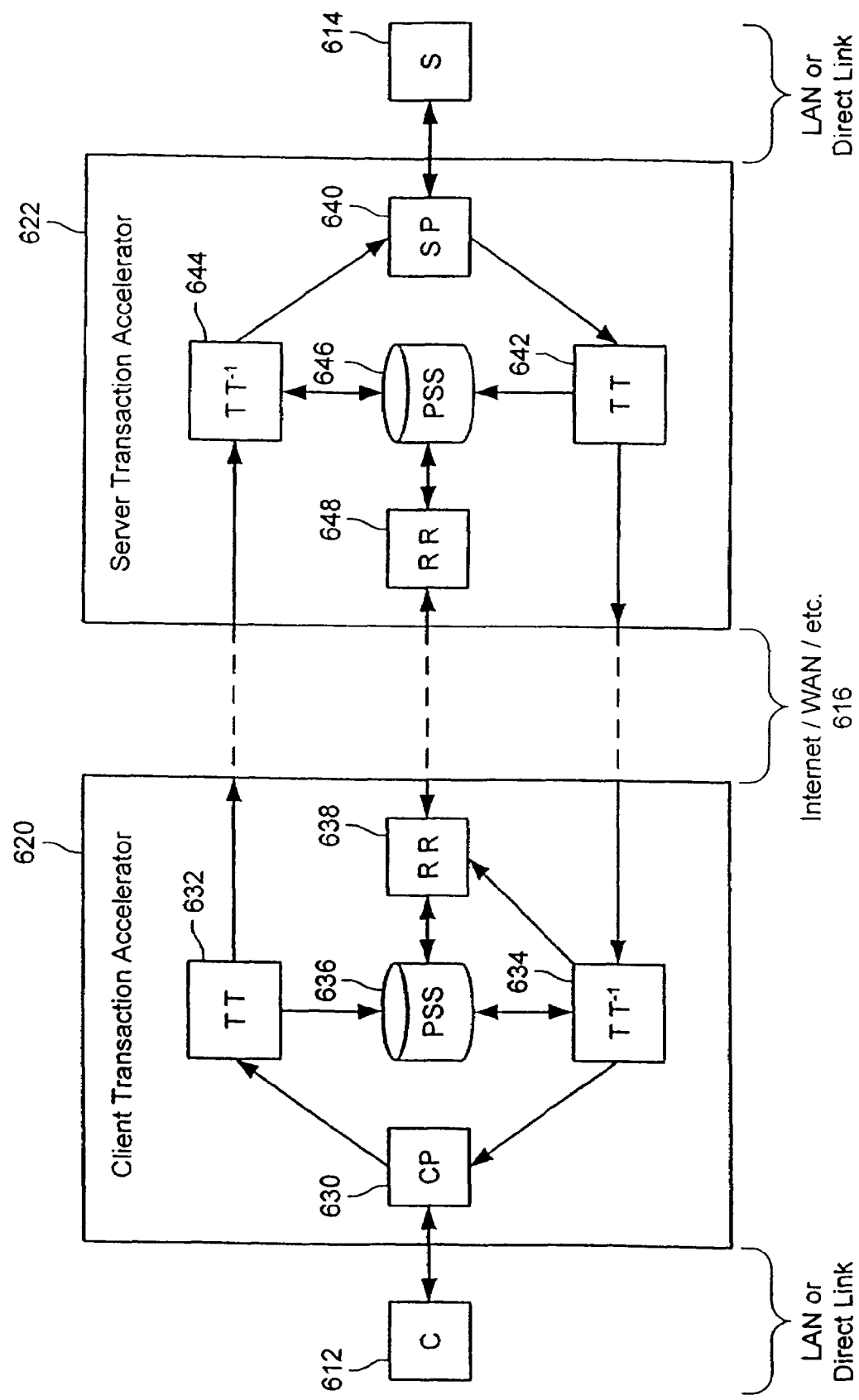
FIG. 12 is a block diagram of a networked client-server pair where some traffic between the client and the server is routed through a client-side transaction accelerator ("CTA") and a server-side transaction accelerator ("STA").

FIG. 12 illustrates an example of a system where HCS coding described herein might be used. As shown there, a client 612 is coupled to a server 614 over a network 616, via a client-side transaction accelerator ("CTA") 620 and a server-side transaction accelerator ("STA") 622. While only one client and one server are shown, it should be understood that the CTA and STA might well operate with multiple clients and/or multiple servers.

Client 612 is coupled to a client proxy 630 of CTA 620. The other elements of CTA 620 shown in FIG. 12 include a transaction transformer (TT) 632, an inverse transaction transformer ($TT^{-1}$) 634, a persistent segment store (PSS) 636 and a reference resolver (RR) 638. Server 614 is coupled to a server proxy 640 of STA 622, which is shown including elements similar to those of CTA 620, such as a transaction transformer (TT) 642, an inverse transaction transformer ($TT^{-1}$) 644, a persistent segment store (PSS) 646 and a reference resolver (RR) 648.

Client 612 is coupled to client proxy 630, which is coupled to TT 632 and $TT^{-1}$ 634. TT 632 is coupled to PSS 636 and to the network between CTA 620 and STA 622. $TT^{-1}$ 634 is coupled to PSS 636, client proxy 630, RR 638 and to the network between CTA 620 and STA 622. RR 638, as shown, is also coupled to PSS 636 and to the network between CTA 620 and STA 622.

On the other side of the figure, server 614 is coupled to server proxy 640, which is coupled to TT 642 and $TT^{-1}$ 644. TT 642 is coupled to PSS 646 and to the network between STA 622 and CTA 620. $TT^{-1}$ 644 is coupled to PSS 646, server proxy 640, RR 648 and to the network between STA 622 and CTA 620. RR 648, as shown, is also coupled to PSS 646 and to the network between STA 622 and CTA 620.

Of the connections shown, arrows indicate the most common direction or directions of flow of information, but information could flow in additional directions and information flow in a single direction might involve data flowing in the reverse direction as well. For example, TT 632 generally sends information in the direction of $TT^{-1}$ 644, but that might involve data such as confirmations, handshakes, etc., flowing from $TT^{-1}$ 644 to TT 632.

In operation, the CTAs and STAs segment the payloads of their transactions where warranted and store/cache strings or other sequences of data ("segments") derived from those payloads using a unique naming scheme that can be independent of the transaction and when sending the payload from one TA to another, substitute references to the segments for the segment data when the segment data is such that the sender can expect that the receiver would have that uniquely named segment data, either because it appeared in an earlier transaction or was sent through other processes to the receiver.

For example, the client-server interactions may involve the transfer of file data from the server to the client, though this is just one special case of a client-server transaction-oriented application. Here, client 612 requests a number of files from server 614 by sending file open requests to server 614. These requests are proxied by client proxy 630, which interacts with STA 622, which in turn proxies the requests to server 614 via its proxy 640. In this manner, the client-server communications can be accelerated in a manner transparent (except for performance improvements) to the other entity. Client proxy 630 routes the requests to TT 632, which being file open requests, are probably not encoded. The response from server 614 is assumed to contain a payload comprising a portion of the request files. In some systems, a server first responds to a file request message with a short response and includes a payload only when the client makes a file read request on an open file. Here, we assume that the server is returning file contents as payload.

When server proxy 640 receives the response message and its payload, it conveys the data to TT 642, which encodes the response message (or just its payload), as is described below, and adds any bindings it creates to PSS 646, if they do not already exist, and sends the encoded message to $TT^{-1}$ 634, which reconstructs the message and relays it to client 612 via client proxy 630. $TT^{-1}$ 634 can reconstruct the message because it has the bindings to replace segment references in the message. Those bindings come from PSS 636 and where they are not in PSS 636, reference resolver 638 can get the bindings from reference resolver 648. In this manner, messages can be encoded and decoded transparent to the message sender and recipient.

As each TT creates bindings, it assigns globally unique reference labels so that a recipient of a reference label will always be able to replace it with unambiguous segment data. Several schemes are usable to ensure unique names, as described in McCanne I.

HCS-Enabled File System

Another embodiment of the present invention uses HCS within a file system. By properly applying HCS to the design of a file system, substantial gains in capacity can be achieved by recognizing patterns of repeated data across all the files (and data structures) in a file system and, accordingly, storing any given pattern of data just once on disk. One approach to leveraging HCS in a file system in this fashion is to incorporate the HCS Encoder and HCS Decoder as native components of a native file system. For example, whenever the file system reads or writes a disk block, HCS could be applied to these disk blocks. However, this direct approach may introduce performance problems as many applications require high-performance file I/O but the HCS coding processes could introduce computational overhead. Also, HCS works most efficiently when presented with large, contiguous regions of application or file data and many implementations of file systems typically manipulate files using relatively small, fixed-size blocks.

Figure 13:
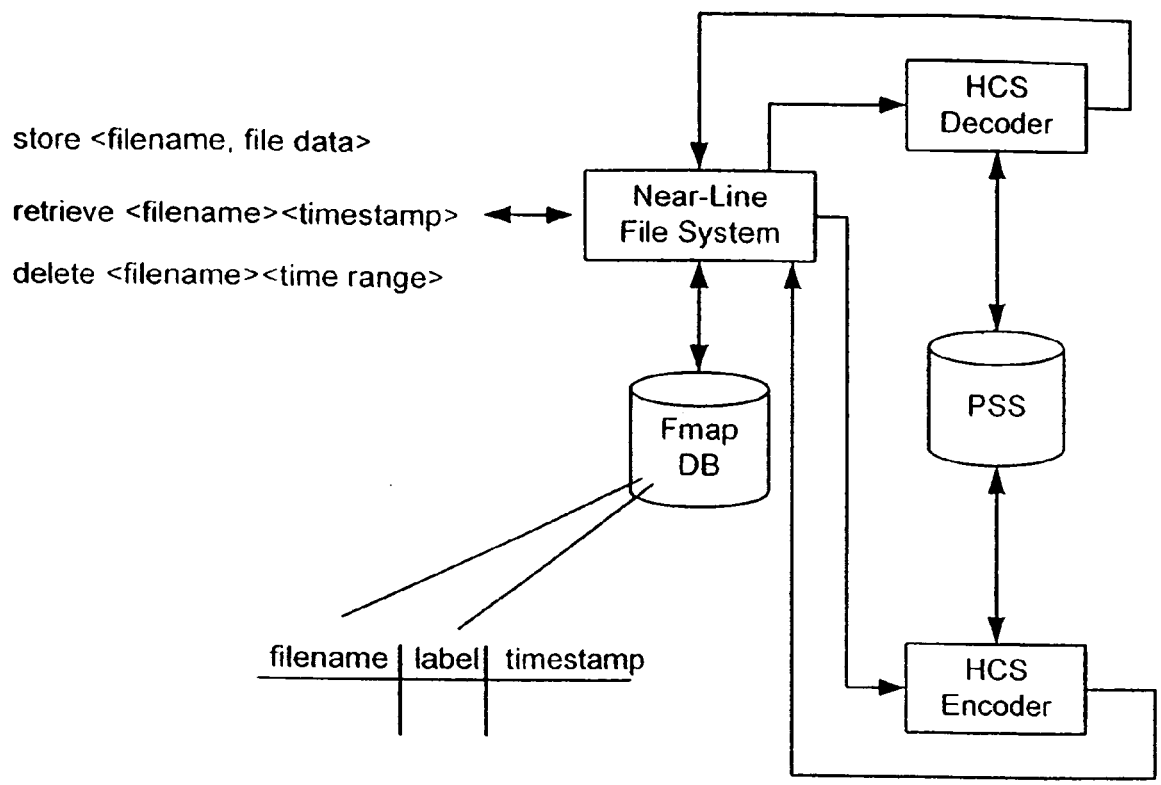
FIG. 13 illustrates a file system using hierarchical content-induced segmentation.

A better approach is to apply HCS to a file system that employs whole-file accesses rather than block-based accesses. The system shown in FIG. 13 implements a file system with a whole-file interface and leverages HCS. That is, clients store, retrieve, and delete entire files instead of individual pieces of files. While this approach typically could not support a standard file-system interface, it is well suited for other uses of file systems, e.g., as the foundation of a backup system. A disk-based, on-line backup system, where access is slower than a native file system but faster than a traditional backup system (e.g., based on tape), is often called "near-line" storage to describe the compromise between a high-performance, on-line file system and low-performance, off-line backup system. Thus, herein, the file system depicted in FIG. 13 is called a "near-line file system (NLFS)".

In the model shown, a client can store, retrieve, and delete whole files. The NLFS employs an HCS Encoder, PSS, and HCS Decoder to efficiently store file data such that only a single copy of each common segment need be stored once. In addition, the NLFS employs a data base table, called the "file map data base (FMDB)", to map file names to the top-level label (or labels) that represents a particular file. In one embodiment, the FMDB includes a time stamp field so that the file system may contain multiple copies of the same file that represent the file at different points in time.

The system functions as follows. A client stores or updates a file by sending a "STORE" command to the file system followed by the file name and file data. The file system then transmits all of the file data to the HCS Encoder, which returns one or more labels that represent the stored file. Those labels are then entered into the FMDB as part of the tuple representing the new or updated file. Included in this tuple is the corresponding file name and current time stamp (taken from a time-of-day clock, for example).

To retrieve a file, a client sends a "RETRIEVE" command to the file system along with the filename and optional time stamp. The file system, in turn, sends a query to the FMDB with the file name as the key, retrieving all tuples that contain said file name. If there are no such tuples, an error is returned to the client. The file system then selects the tuple with the greatest time stamp that is less than or equal to the specified time stamp. If no time stamp is specified in the command, the tuple with the greatest time stamp is chosen. This has the effect of choosing the version of the file that was stored in the system at the requested time. Next, the file system sends the label string from the selected tuple to the HCS Decoder. The HCS Decoder, in turn, decodes the labels into file data and returns that data to the file system. The file system then returns the file data to the client. Of course, this process could be pipelined such that the file system could deliver file data to the client as the decoder delivers the decoded file to the file system.

To delete a file from the file system, a client sends a "DELETE" command to the file system along with the filename and an optional time range, instructing to delete all files that were stored with respect to the time range specified. In response, the NLFS looks up and removes the corresponding entries from the FMDB and deletes the corresponding labels from the PSS.

In one embodiment, the NLFS component is deployed in a standard backup architecture and interfaces with clients desiring backup service through standard protocols like NDMP.

Figure 14:
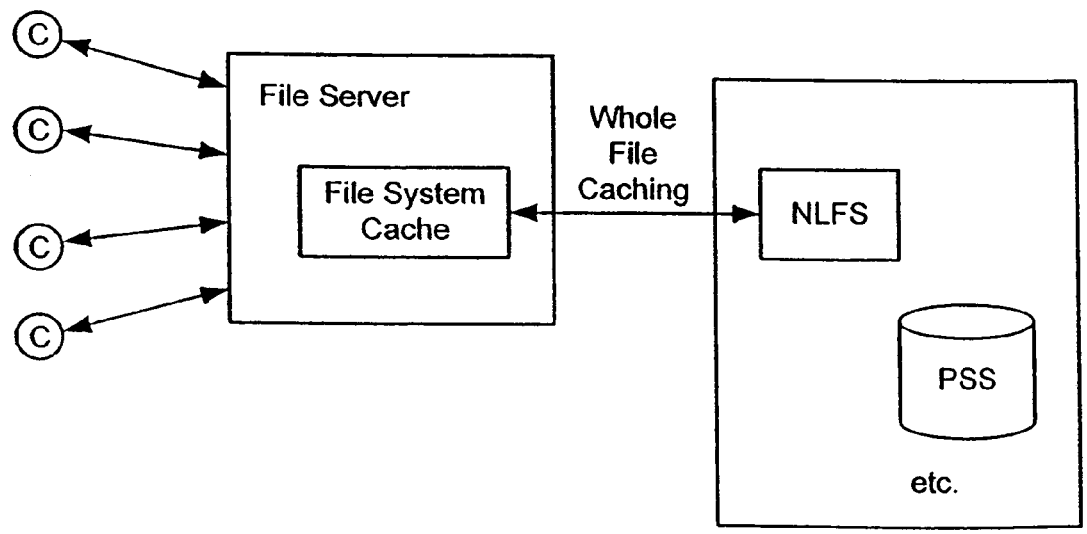
FIG. 14 illustrates a near-line file system (NLFS) and file server front end.
Figure 3:
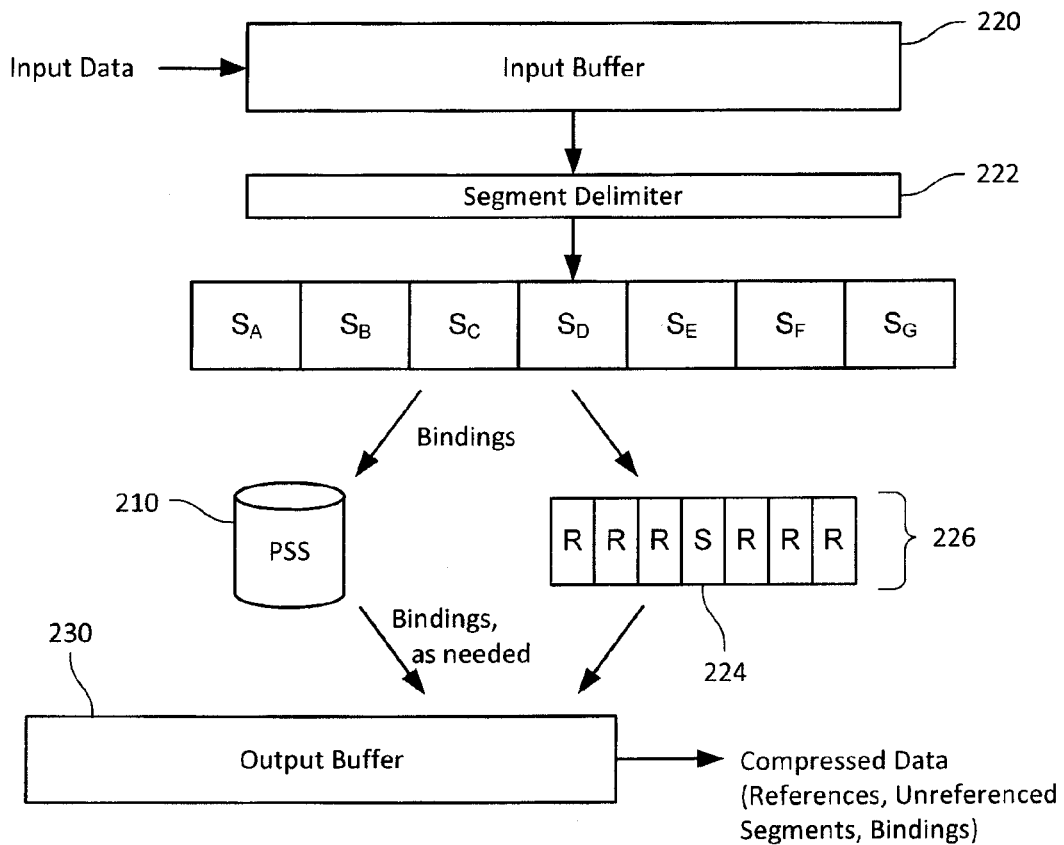
Figure 4:
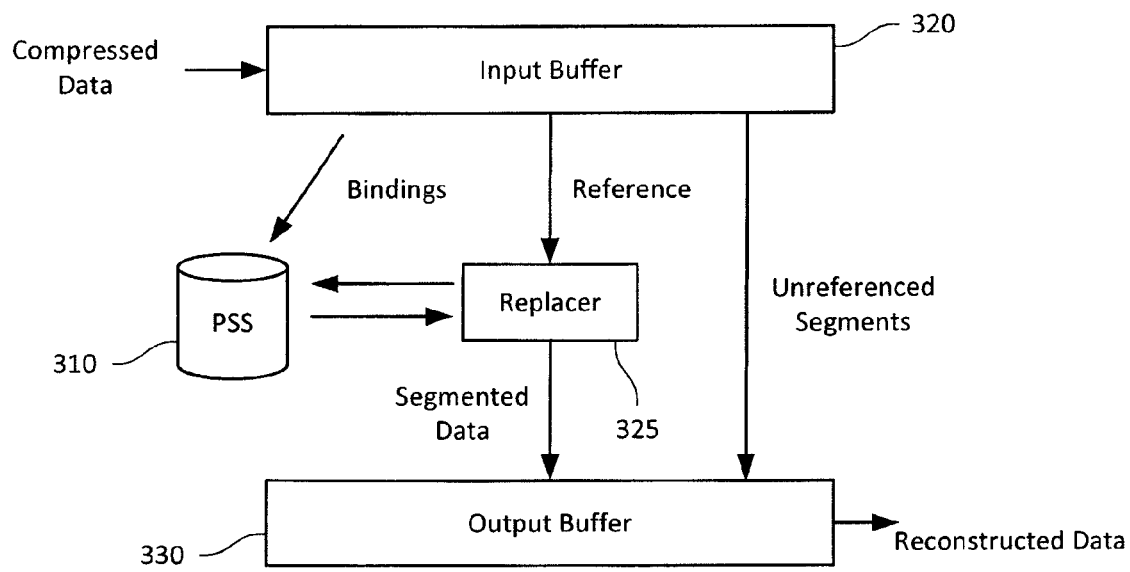

In another embodiment, HCS can be used as a complementary component of a more standard, operating system-based file system by combing the NLFS described above with a file system front-end. This approach is depicted in FIG. 14, which shows NLFS and a file server front-end. In this approach, whenever one or more clients open a particular file, the file server reads the file from the NLFS system and copies the file into a local file system. This file is effectively cached in the local front-end file system, which allows the file server to employ normal file system protocols and algorithms for managing the open file. By ensuring that only the front-end file server communicates with the NLFS and by employing normal file system locking and consistency mechanisms, there is no possibility that the files stored in the NLFS become inconsistent with those in the file server's local file system. When all clients close the file, the file server writes back the file to the NLFS and frees up the corresponding storage in the local file server.

There are many ways to build the front-end file server based on well-known techniques for file system design and whole file caching, but in one embodiment, the well-known unix file system (UFS) is extended to interface with NLFS. For example, UFS (as well as other file systems) uses directories to map file names to disk data structures. In UFS, the directory entry for a file points to an index node (or inode). UFS, thus, could be extended with a new inode type that contains a reference to a file in NLFS. Under this scheme, when a client opens an existing file, UFS checks for the new inode type and when this is the case, reads the file from the NLFS. UFS then writes the returned file data in the local file system effectively formatting the file data onto a local disk using normal inode data structures. In effect, the single inode pointing to an NLFS file is replaced with a multitude of inodes and disk blocks to represent the actual file locally.

At this point, the client open call finishes. Thereafter, all client file activity proceeds identically to the traditional UFS model (including cases where multiple clients open the same file simultaneously) and any file updates or changes are reflected in the local file copy. When the file is closed (by all clients), the modified UFS then reads the file data from local file system (using the normal inode data structures) and writes this data back to the NLFS. When the file is successfully written, the inodes representing the file data can be freed up and replaced with a single inode of the new type that points to NLFS. Alternatively, the file can be copied out the NLFS in this fashion without necessarily freeing up the local copy of the file so that future accesses to the file do not need to wait for NLFS. Then, later, when the local file system begins to fill to capacity, the UFS could free up files using the method describe above by applying any number of the numerous well-known cache replacement policies (e.g., least recently used, least frequently accessed, and so forth).

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method for performing a backup of files, the method comprising:

receiving, at a backup system, a plurality of files to be backed up;

segmenting, with a segmenter of the backup system, each file into one or more segments;

forming a list for each file, wherein forming a list comprises:

(a) determining whether each segment is present in a segment store, wherein a segment that is present in the segment store has an assigned reference label;

(b) for each segment present in the segment store, adding to the list the assigned reference label; and (c) for each segment not present in the segment store, assigning a reference label to the segment, storing the segment and the reference label, and adding the reference label to the list; and storing, in a database of the near-line file system, an association between each file and the corresponding list.

2. The method of claim 1, wherein the plurality of files are received from a file server that is connected with a plurality of clients.

3. The method of claim 1, wherein the backup system is a near-line file system.

4. The method of claim 1, wherein the segment and its assigned reference label are both stored in the segment store.

5. The method of claim 1, wherein the reference labels are partly independent of content of a segment.

6. The method of claim 1, further comprising adding a time stamp to a list.

7. The method of claim 1, further comprising:

determining whether any sequence of segments is grouped as a reference group, wherein forming a list further comprises:

(d) determining whether a reference group is present in the segment store, wherein the segment store includes a group label to the reference labels of the reference group present in the segment store;

(e) for each reference group present in the segment store, adding to the list the group label; and (f) for each reference group not present in the segment store, assigning a reference label to a reference group segment not present in the segment store, storing the reference group segment and the reference label in the segment store, assigning a group label to the reference labels of the reference group, storing the group label in the segment store, and adding the group label to the list.

8. A backup system for performing a backup of files, the near-line backup system comprising:

an interface for receiving a plurality of files to be backed up;

a segmenter configured to segment each file;

an encoder for forming a list for each file, the encoder comprising:

(a) logic configured to determine whether each segment is present in a segment store, wherein a segment that is present in the segment store has an assigned reference label;

(b) for each segment present in the segment store, logic configured to add to the list the assigned reference label; and (c) for each segment not present in the segment store, logic configured to assign a reference label to the segment, store the segment and the reference label, and add the reference label to the list; and logic configured to store an association between each file and the corresponding list in a database of the near-line file system.

9. The backup system of claim 8, wherein the interface is configured to receive the files from a file server that is connected with a plurality of clients.

10. The backup system of claim 8, wherein the backup system is a near-line file system.

11. The backup system of claim 8, wherein the segment and its assigned reference label are both stored in the segment store.

12. The backup system of claim 8, wherein the reference labels are partly independent of content of a segment.

13. The backup system of claim 8, further comprising logic configured to add a time stamp to a list.

14. The backup system of claim 8, further comprising:

a sequence determiner for determining whether any sequence of segments is grouped as a reference group, wherein the encoder further comprises:

(d) logic configured to determine whether a reference group is present in the segment store, wherein the segment store includes a group label to the reference labels of the reference group present in the segment store;

(e) for each reference group present in the segment store, logic configured to add to the list the group label; and (f) for each reference group not present in the segment store, logic configured to assign a reference label to a reference group segment not present in the segment store, store the reference group segment and the reference label in the segment store, assign a group label to the reference labels of the reference group, store the group label in the segment store, and add the group label to the list.

15. The backup system of claim 8, wherein the interface is NFS.

16. The backup system of claim 8, wherein the interface is CIFS.

17. The backup system of claim 8, further comprising:

a decoder for decoding a list for each file, the decoder comprising logic configured to replace reference labels with segments of the file to recreate the file.

* * * * *

UNITED STATES PATENT AND TRADEMARK OFFICE
CERTIFICATE OF CORRECTION

| | | |
|---|---|---|
| PATENT NO. | : 7,477,166 B2 | |
| APPLICATION NO. | : 11/508531 | |
| DATED | : January 13, 2009 | |
| INVENTOR(S) | : Steven McCanne and Michael J. Demmer | |

It is certified that error appears in the above-identified patent and that said Letters Patent is hereby corrected as shown below:

In the Drawings, please replace Drawing Sheet 2 with the attached replacement one (1) sheet, showing replacement Fig. 4 as corrected.

Signed and Sealed this
Twenty-third Day of October, 2012

David J. Kappos
*Director of the United States Patent and Trademark Office*